(12) United States Patent
Park et al.

(10) Patent No.: US 7,812,390 B2
(45) Date of Patent: Oct. 12, 2010

(54) SEMICONDUCTOR MEMORY DEVICE WITH MEMORY CELLS ON MULTIPLE LAYERS

(75) Inventors: Ki-Tae Park, Sungnam-si (KR); Jung-Dal Choi, Suwon-si (KR); Jae-Sung Sim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 440 days.

(21) Appl. No.: 11/777,293

(22) Filed: Jul. 13, 2007

(65) Prior Publication Data

US 2008/0023747 A1  Jan. 31, 2008

(30) Foreign Application Priority Data

Jul. 25, 2006   (KR) ...................... 10-2006-0069892

(51) Int. Cl.
*H01L 25/065* (2006.01)
*H01L 27/115* (2006.01)

(52) U.S. Cl. ........................ 257/315; 257/211; 257/314; 257/316; 257/E25.013; 257/E25.03

(58) Field of Classification Search .................. 257/202, 257/211, 314–316, E25.013, E25.025, E25.03, 257/E29.3
See application file for complete search history.

(56) References Cited

U.S. PATENT DOCUMENTS

| | | | |
|---|---|---|---|
| 5,091,762 A | 2/1992 | Watanabe | |
| 5,835,396 A | 11/1998 | Zhang | |
| 6,034,882 A | 3/2000 | Johnson et al. | |
| 6,295,227 B1 * | 9/2001 | Sakui et al. | 365/185.17 |
| 6,836,444 B2 * | 12/2004 | Nakamura et al. | 365/230.03 |
| 6,879,505 B2 * | 4/2005 | Scheuerlein | 365/51 |
| 7,002,825 B2 | 2/2006 | Scheuerlein | |
| 7,112,815 B2 * | 9/2006 | Prall | 257/2 |
| 7,411,819 B2 * | 8/2008 | Takeuchi | 365/185.03 |
| 7,683,404 B2 * | 3/2010 | Jang et al. | 257/211 |
| 2003/0095448 A1 * | 5/2003 | Ichige et al. | 365/200 |
| 2003/0214835 A1 | 11/2003 | Nejad et al. | |
| 2005/0184329 A1 | 8/2005 | Prall | |
| 2006/0108627 A1 * | 5/2006 | Choi et al. | 257/314 |
| 2006/0146608 A1 * | 7/2006 | Fasoli et al. | 365/185.17 |

\* cited by examiner

*Primary Examiner*—Anh Phung
*Assistant Examiner*—Allison P Bernstein
(74) *Attorney, Agent, or Firm*—Volentine & Whitt, PLLC

(57) ABSTRACT

A semiconductor memory device includes a first substrate having at least one string including a first select transistor, a second select transistor, and first memory cells connected in series between the first and second select transistors of the first substrate. The semiconductor memory device further includes a second substrate having at least one string including a first select transistor, a second select transistor, and second memory cells connected in series between the first and second select transistors of the second substrate. The number of the first memory cells of the at least one string of the first substrate is different from a number of the second memory cells of the at least one string of the second substrate. For example, the number of second memory cells may be less than the number of first memory cells.

16 Claims, 5 Drawing Sheets

Fig. 3

|  | Read | PGM | Erase |
|---|---|---|---|
| SSLM | Vread | Vcc | F |
| LSSL1 | 0V | Vcc | F |
| LSSL2 | Vread | Vcc | F |
| LSSL3 | 0V | Vcc | F |
| Selected WL | Vr | Vpgm | 0V |
| Unselected WL | Vread | Vpass | 0V |
| LGSL, GSLM | Vread | 0V | F |
| CSL | 0V | 1V | F |

(F : float)
(Vr : 0V or more)

SEMICONDUCTOR MEMORY DEVICE WITH MEMORY CELLS ON MULTIPLE LAYERS

CROSS-REFERENCE TO RELATED APPLICATIONS

A claim of priority is made to Korean Patent Application 10-2006-0069892, filed on Jul. 25, 2006, the subject matter of which is hereby incorporated by reference.

BACKGROUND OF THE INVENTION

1. Field of the Invention

The present invention relates to a semiconductor memory device and, more particularly, to a semiconductor memory device having memory cells on multiple layers.

2. Description of the Related Art

Requirements for high-density memories have accompanied advances in the development of semiconductor fabrication techniques. Various methods have been proposed to satisfy such requirements, including, for example, a memory device having a three-dimensional array structure (hereinafter, referred to as "3D memory device"). Examples of 3D memory devices are described in U.S. Pat. No. 5,835,396, entitled "Three-Dimensional Read-Only Memory," U.S. Pat. No. 6,034,882, entitled "Vertically Stacked Field Programmable Nonvolatile Memory and Method of Fabrication," and U.S. Pat. No. 7,002,825, entitled "Word Line Arrangement Having Segmented Word Lines," the contents of which are hereby incorporated by reference.

A 3D memory device includes memory cell arrays that are respectively formed on multiple semiconductor material layers. The semiconductor material layers may include a well-known silicon semiconductor substrate and substrates sequentially stacked on the silicon semiconductor substrate. For example, the stacked substrates may be epitaxial layers, formed by an epitaxial process. Electrical characteristics of substrates formed through the epitaxial process are different from those of a silicon substrate. Typically, substrates formed through the epitaxial process have lower electrical performance characteristics than a silicon substrate. This means that performance and/or reliability of a 3D memory device (e.g., having one or more epitaxial layers) may be inferior to that of a two-dimensional memory device formed on a single silicon substrate.

SUMMARY OF THE INVENTION

An aspect of the present invention provides a semiconductor memory device including a first substrate having at least one string comprising a first select transistor, a second select transistor, and first memory cells connected in series between the first and second select transistors of the first substrate; and a second substrate having at least one string comprising a first select transistor, a second select transistor, and second memory cells connected in series between the first and second select transistors of the second substrate. A number of the first memory cells of the at least one string of the first substrate is different from a number of the second memory cells of the at least one string of the second substrate.

For example, the number of the second memory cells may be less than the number of the first memory cells. The first memory cells may store M-bit data, and the second memory cells may store at least one of single-bit data or N-bit data, where $2 < N < M$. A channel length of each of the second memory cells may be longer than a channel length of each of the first memory cells.

The semiconductor memory device may be a NAND flash memory device. Also, the first substrate may be a silicon substrate and the second substrate may be an epitaxial layer, e.g., formed by an epitaxial process. Alternatively, the second substrate may be a second silicon substrate opposing the first silicon substrate. The first memory cells may include a first memory block and the second memory cells may include a second memory block.

The semiconductor memory device may further include a first plug connected to drains of the first select transistors; a first switch transistor configured to connect the first plug to a bit line via a second plug; a third plug connected to sources of the second select transistors; and a second switch transistor configured to connect the third plug to a common source line. The first switch transistor may be activated when one of the strings is selected, and each of the first select transistors may be activated when a corresponding string is selected. The second select transistors and the second switch transistor may be activated simultaneously. The semiconductor memory device may also include a peripheral circuit block on the first substrate, the peripheral circuit block being configured to control the first and second select transistors and the first and second memory cells of the strings.

Another aspect of the present invention provides a semiconductor memory device having a first silicon substrate having at least one string including a first select transistor, a second select transistor and memory cells connected in series between the first select transistor and the second select transistor. The semiconductor memory device also has a memory material layer having at least one string including a first select transistor, a second select transistor and memory cells connected in series between the first select transistor and the second select transistor. A number of the memory cells in the at least one memory material layer string is less than a number of the memory cells in the at least one first silicon substrate string. A first plug is connected to drains of the first select transistors, and a first switch transistor is configured to connect the first plug to a bit line via a second plug. A third plug is connected to sources of the second select transistors, and a second switch transistor is configured to connect the third plug to a common source line. A peripheral circuit block, on the first silicon substrate, is configured to control the first and second select transistors and the memory cells in each of the at least one first silicon substrate string and the at least one memory material layer string.

BRIEF DESCRIPTION OF THE DRAWINGS

The embodiments of the present invention will be described with reference to the attached drawings, in which:

FIG. 3 is a table showing an operating condition of the 3D memory array illustrated in FIG. 2, according to an exemplary embodiment of the present invention;

DETAILED DESCRIPTION OF THE EMBODIMENTS

Figure 1:
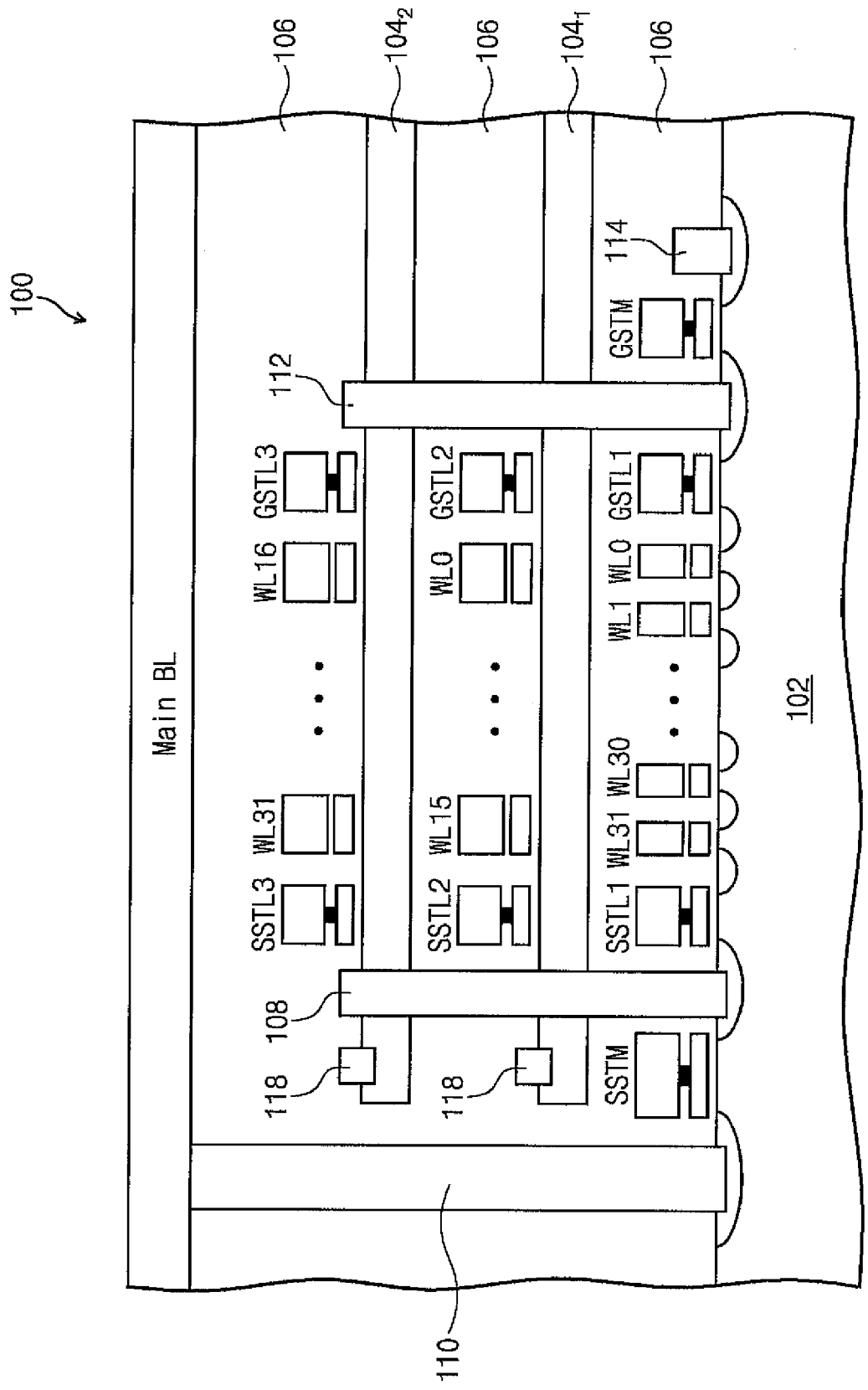
FIG. 1 is a diagram showing a cross section of a 3D memory array, according to an exemplary embodiment of the present invention.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements and techniques are not described with respect to some of the embodiments of the present invention. Throughout the drawings and written description, like reference numerals will be used to refer to like or similar elements.

FIG. 1 is a diagram showing a cross section of a 3D memory array, according to an exemplary embodiment of the present invention.

A 3D memory array 100 according to the present embodiment may be, for example, a flash memory array, a read-only memory array, a silicon-oxide-nitride-oxide silicon (SONOS) memory array, or the like. The memory array 100 includes a semiconductor substrate 102 that consists of silicon or the like.

Multiple memory layers, such as memory material layers $104_1$ and $104_2$, may be formed at different levels within the memory array 100. In particular, the memory material layers $104_1$ and $104_2$ may be overlapped/stacked on the semiconductor substrate 102. Each of the memory material layers $104_1$ and $104_2$ may be an epitaxial layer, for example, formed using an epitaxial process.

Between the memory material layers $104_1$ and $104_2$, an insulating layer 106, such as an oxide film, is formed to isolate the memory material layers $104_1$ and $104_2$ from one another, or from any other memory material layers, semiconductor substrates, or the like. In one embodiment, the insulating layer 106 may include bulk dielectric layers, such as BSG (BoroSilicate Glass), PSG (PhosphoSilicate Glass), and BPSG (BoroPhosphoSilicate Glass).

Strings of memory cells are formed on the semiconductor substrate 102 and the memory material layers $104_1$ and $104_2$, respectively. For the purpose of simplifying discussion, only one string is illustrated on the semiconductor substrate 102 and on each of the memory material layers $104_1$ and $104_2$, respectively, although it is understood that each of the semiconductor substrate 102 and the memory material layers $104_1$ and $104_2$ may include multiple strings.

Figure 2:
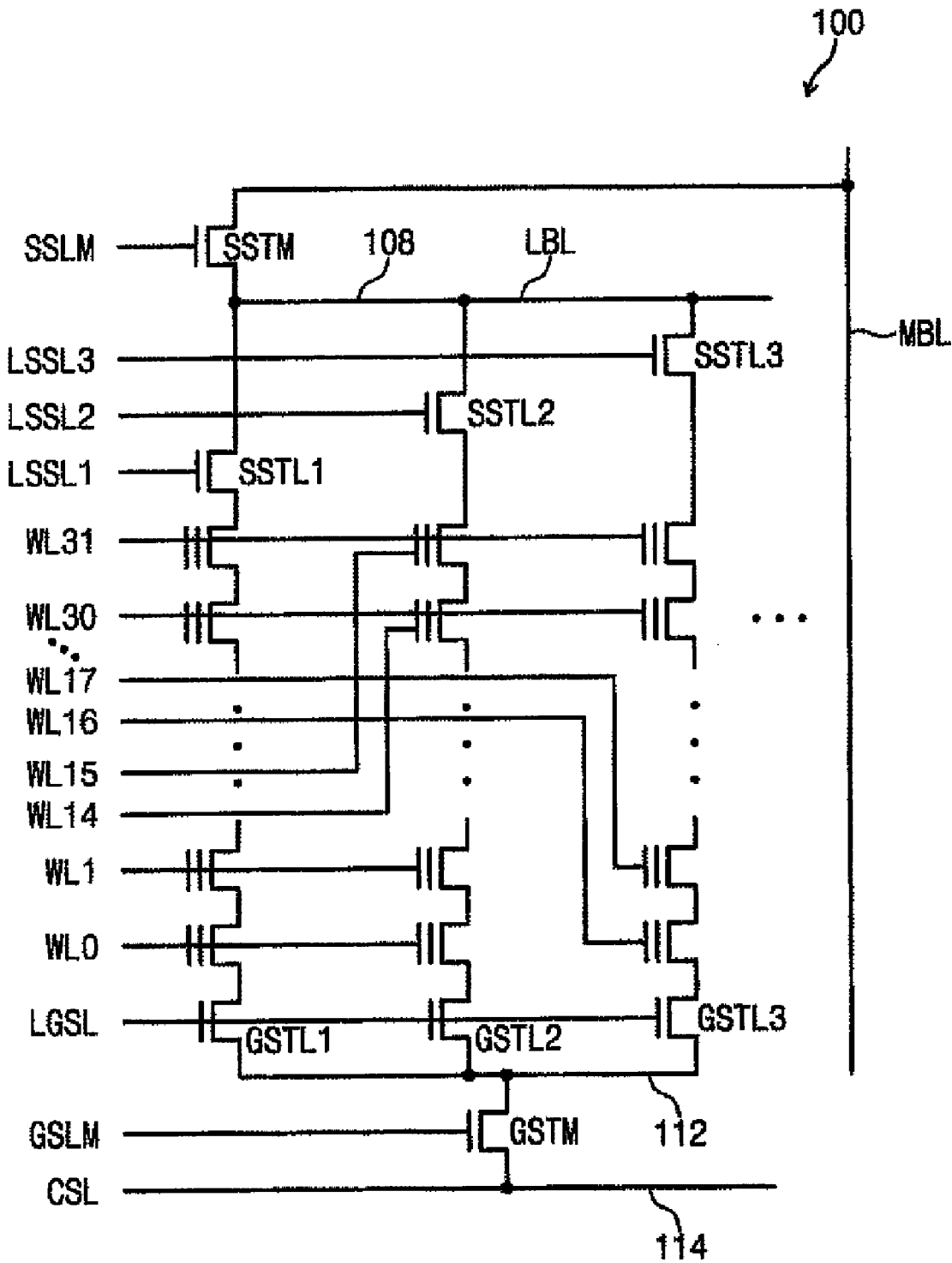
FIG. 2 is a circuit diagram showing an equivalent circuit of the 3D memory array illustrated in FIG. 1, according to an exemplary embodiment of the present invention.

Each string includes a first select transistor, a second select transistor and multiple memory cells serially connected between the first and second select transistors. For example, the string depicted on the semiconductor substrate 102 includes a first select transistor SSTL1, a second select transistor GSTL1, and multiple memory cells (e.g., indicated by corresponding wordlines WL0 through WL31) serially connected between the first and second select transistors SSTL1 and GSTL1. A string depicted on the memory material layer $104_1$ includes a first select transistor SSTL2, a second select transistor GSTL2, and multiple memory cells serially connected between the first and second select transistors SSTL2 and GSTL2. Likewise, a string depicted on the memory material layer $104_2$ includes a first select transistor SSTL3, a second select transistor GSTL3, and multiple memory cells serially connected between the first and second select transistors SSTL3 and GSTL3. The first select transistors SSTL1, SSTL2 and SSTL3 are respectively controlled by corresponding select signals LSSL1, LSSL2 and LSSL3, while the second select transistors GSTL1, GSTL2 and GSTL3 are commonly controlled by a select signal LGSL, as illustrated in FIG. 2.

Drains of the first select transistors SSTL1, SSTL2 and SSTL3 are connected commonly to a contact plug 108, which is electrically connected to a source of a switch transistor, such as the main string select transistor SSTM. A drain of the main string select transistor SSTM is electrically connected to a contact plug 110, which is connected to a bit line MBL. The bit line MBL may be used as a main bit line, and the contact plug 108 may be used as a local bit line. The main string select transistor SSTM may be activated when one of the strings is selected, and each of the first select transistors SSTL1, SSTL2 and SSTL3 may be activated when a corresponding string is respectively selected.

Sources of the second select transistors GSTL1, GSTL2 and GSTL3 are commonly connected to a contact plug 112. The contact plug 112 is electrically connected to a drain of a switch transistor, such as the main ground select transistor GSTM, and a source of the main ground select transistor GSTM is electrically connected to a common source line (CSL) 114. The common source line 114 may be used as a main common source line, and the contact plug 112 may be used as a local common source line. Also, the second select transistors GSTL1, GSTL2 and GSTL3 may be activated simultaneously with the main ground select transistor GSTM.

As illustrated in FIG. 1, the memory material layers $104_1$ and $104_2$ are supplied with a substrate bias voltage via the corresponding contacts 118. For example, in a read/write or read/program (PGM) operation with respect to the memory cells on the memory material layer $104_1$, a ground voltage may be supplied to the memory material layer $104_1$ via the contact 118. Likewise, in a read/program operation with respect to the memory cells formed on the memory material layer $104_2$, a ground voltage may be supplied to the memory material layer $104_2$ via the contact 118. In an erase operation with respect to the memory cells formed on the memory material layer $104_1$, an erase voltage may be supplied to the memory material layer $104_1$ via the contact 118. Likewise, in an erase operation with respect to the memory cells formed on the memory material layer $104_2$, an erase voltage may be supplied to the memory material layer $104_2$ via the contact 118.

In accordance with the 3D memory array 100 of the present embodiment, the number of memory cells in a string formed on the substrate 102 is different from the number of memory cells in a string formed on each of the memory material layers $104_1$ and $104_2$. For example, the number of memory cells in a string formed on the substrate 102 may be greater than the number of memory cells in a string formed on each of the memory material layers $104_1$ and $104_2$, as depicted in FIG. 1.

Because memories are highly integrated, e.g., for the purpose of scaling devices, a size of each memory cell may be miniaturized. That is, a channel length (or a distance between a source and a drain of a transistor) may be reduced, causing an increase in short channel effect, known as punch-through (or breakdown effect). Short channel effect may deteriorate device characteristics (e.g., memory cell characteristics).

It is possible to increase the size of the memory cells on the respective memory material layers $104_1$ and $104_2$, for example, by reducing the number of memory cells formed on each of the memory material layers $104_1$ and $104_2$. As memory cell sizes increase, the short channel effect is reduced, improving the device characteristics.

For example, when a string formed on the semiconductor substrate 102 consists of 32 memory cells, a string formed on each of the memory material layers $104_1$ and $104_2$ may consist of only 16 memory cells, so that the memory cells on the memory material layers $104_1$ and $104_2$ may be larger than the memory cells on the substrate 102. In this case, word lines for controlling the memory cells on the substrate 102 may be connected to correspond to memory cells on each of the memory material layers $104_1$ and $104_2$. Referring to FIG. 2, the 32 memory cells on the semiconductor substrate 102 are connected to corresponding word lines WL0 to WL31, the 16 memory cells on the memory material layer $104_1$ are connected to word lines WL0 to WL15, and the 16 memory cells on the memory material layer $104_2$ are connected to word lines WL16 to WL31, respectively.

In the 3D memory array 100 according to the present embodiment, the memory cells formed on the substrate 102 may be used to store M-bit data, and the memory cells formed on the respective memory material layers $104_1$ and $104_2$ may be used to store N-bit data, such that N is less than M and greater than two. Or, the memory cells formed on the respective memory material layers $104_1$ and $104_2$ may be used to store single-bit data. Thus, either one of single-bit data and multi-bit data may be stored in the 3D memory array 100.

FIG. 3 is a table, showing an operating condition of the 3D memory array 100 according to the exemplary embodiment depicted in FIG. 2. It is apparent from the table that a read/write/erase bias condition is essentially the same for the depicted embodiment as that of a conventional NAND flash memory device, except that select signals LSSL1, LSSL2 and LSSL3 are selectively activated.

For example, as indicated in the READ column of the table in FIG. 3, when a string on the memory material layer $104_1$ is selected, the select signal LSSL2 is driven with the read voltage Vread, while the select signals LSSL1 and LSSL3 are driven with a ground voltage (e.g., 0V). Likewise, when a string on the substrate 102 is selected, the select signal LSSL1 is driven with a read voltage Vread, while select signals LSSL2 and LSSL3 are driven with a ground voltage, and when a string on the memory material layer $104_2$ is selected, the select signal LSSL3 is driven with the read voltage Vread, while the select signals LSSL1 and LSSL2 are driven with a ground voltage. As further illustrated in FIG. 3, select signals LGSL and GSLM are driven with the same voltage during the read, write (PGM) and erase operations.

Figure 4:
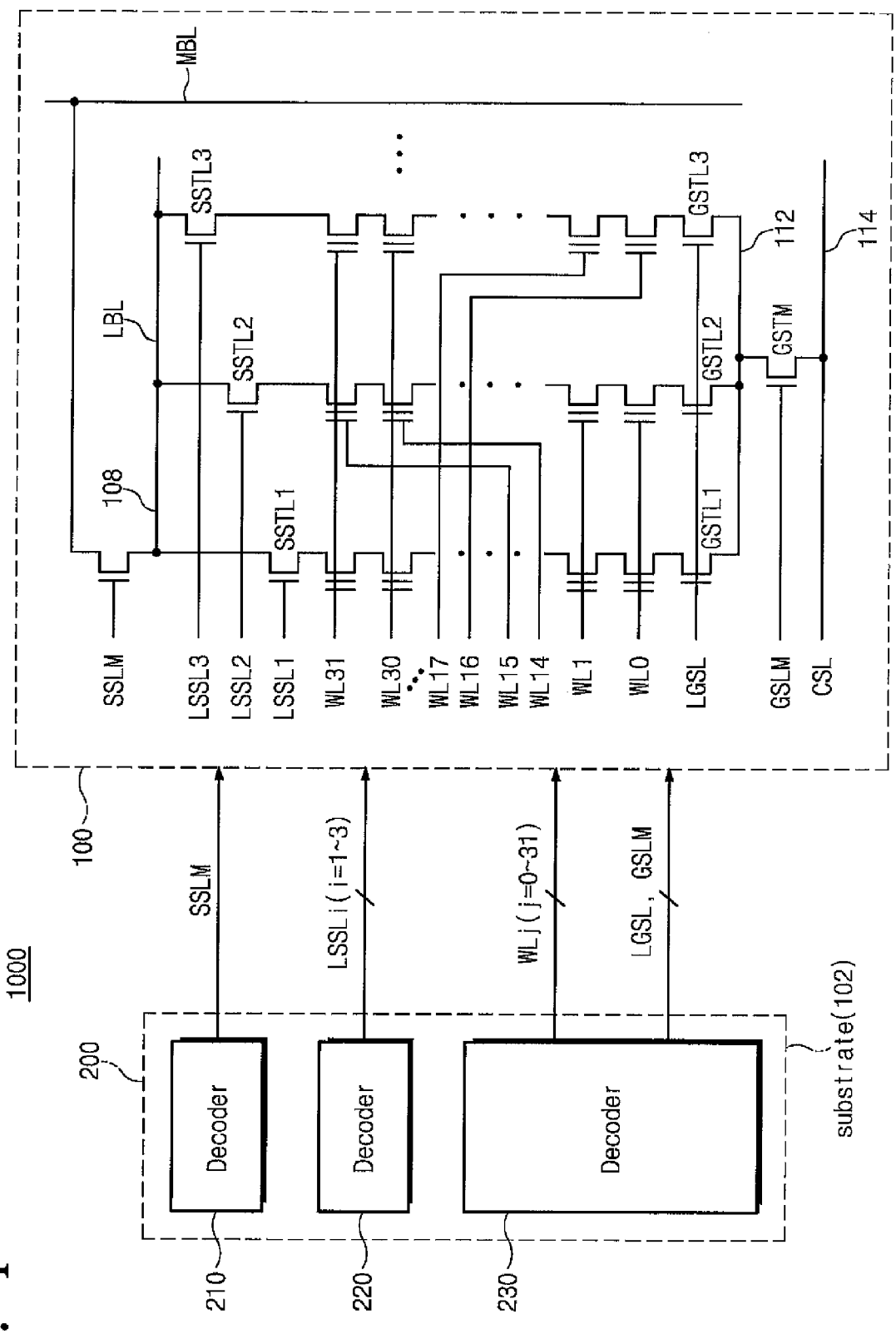
FIG. 4 is a block diagram showing a semiconductor memory device including a 3D memory array illustrated in FIG. 2, according to an exemplary embodiment of the present invention.

FIG. 4 is a block diagram showing a semiconductor memory device including the 3D memory array illustrated in FIG. 2.

Referring to FIG. 4, a semiconductor memory device 1000 according to the present embodiment includes a 3D memory array 100 and peripheral circuit block 200. The 3D memory array 100 is substantially the same as illustrated in FIG. 2, and thus a description of the 3D memory array 100 will not be repeated. The peripheral circuit block 200 may be configured to control read, write and erase operations of the 3D memory array 100 according to a request from an external device, such as a host or a memory controller (not pictured).

The peripheral circuit block 200 may include decoders 210, 220 and 230. The decoder 210 is configured to generate a select signal SSLM for controlling the select transistor SSTM of the 3D memory array 100. The decoder 220 is configured to generate select signals LSSL1, LSSL2 and LSSL3 for controlling select the transistors SSTL1, SSTL2 and SSTL3. The decoder 230 is configured to control the word lines WL0 to WL31, the select lines LGSL and GSLM that are connected to the memory cells, and the select transistors GSTL1, GSTL2, GSTL3 and GSTM. Although not illustrated in FIG. 4, the peripheral circuit block 200 further includes various elements for enabling operation, such as a high voltage generator circuit, control logic and the like.

More particularly, constituent elements of the peripheral circuit block 200 may formed on the semiconductor substrate 102 in FIG. 1, but not on the memory material layers $104_1$ and $104_2$. As described above, electrical characteristics of the memory material layers $104_1$ and $104_2$ are less favorable than those of the substrate 102. Accordingly, it is possible to secure stable operating characteristics of the peripheral circuit block 200 by forming constituent elements of the peripheral circuit block 200 on the semiconductor substrate 102.

Figure 5:
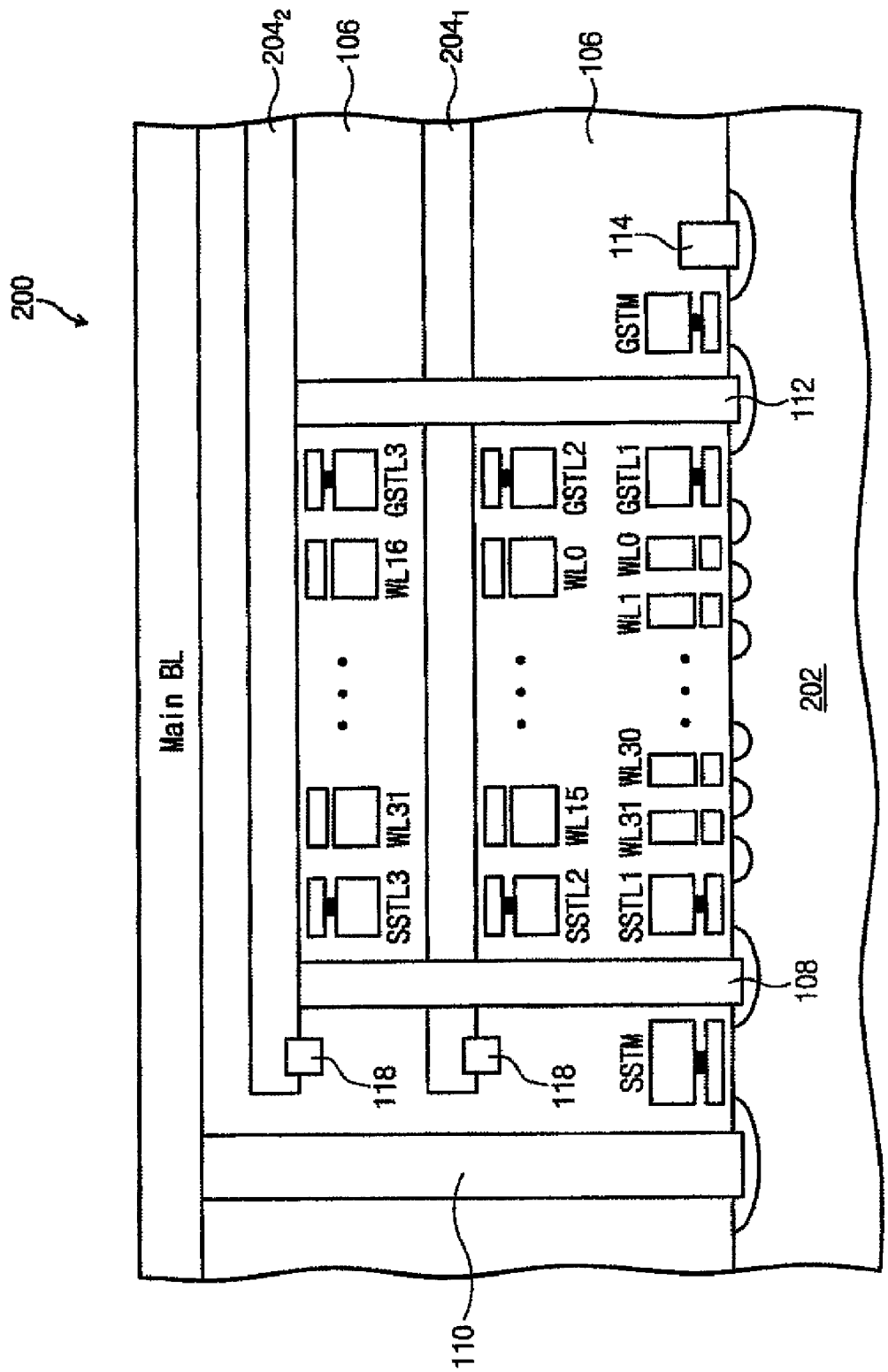
FIG. 5 is a diagram showing a cross section of a 3D memory array, according to another exemplary embodiment of the present invention.

FIG. 5 is a diagram showing a cross-section of a 3D memory array, according to another exemplary embodiment of the present invention. In particular, FIG. 5 depicts a 3D array structure using multiple silicon substrates instead of memory material layers.

As illustrated in FIG. 5, the 3D memory array 200 includes a semiconductor substrate 202, which consists of silicon or the like, and multiple additional substrates, such as silicon substrates $204_1$ and $204_2$, which may be arranged to oppose or face the semiconductor substrate 202. The other elements of the 3D memory array 200, i.e., having the same reference numerals as in the 3D memory array 100, are substantially the same as described with respect to FIG. 1, and thus descriptions of these elements will not be repeated.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A semiconductor memory device comprising:
    a first substrate having at least one string comprising a first select transistor, a second select transistor, and first memory cells connected in series between the first and second select transistors of the first substrate; and
    a second substrate having at least one string comprising a first select transistor, a second select transistor, and second memory cells connected in series between the first and second select transistors of the second substrate,
    wherein a number of the first memory cells of the at least one string of the first substrate is different from a number of the second memory cells of the at least one string of the second substrate, and
    wherein the number of the second memory cells is less than the number of the first memory cells, and wherein a channel length of each of the second memory cells is longer than a channel length of each of the first memory cells.

2. The semiconductor memory device of claim 1, wherein the first memory cells store M-bit data, and the second memory cells store at least one of single-bit data or N-bit data, where 2<N<M.

3. The semiconductor memory device of claim 1, wherein the first substrate comprises a silicon substrate and the second substrate comprises an epitaxial layer.

4. The semiconductor memory device of claim 3, further comprising:
    a peripheral circuit block formed on the first substrate and configured to control the first and second select transistors and the first and second memory cells of the strings.

5. The semiconductor memory device of claim 1, wherein the first substrate comprises a first silicon substrate and the second substrate comprises a second silicon substrate opposing the first silicon substrate.

6. The semiconductor memory device of claim 1, wherein the semiconductor memory device comprises a NAND flash memory device.

7. The semiconductor memory device of claim 1, wherein the first memory cells comprise a first memory block and the second memory cells comprise a second memory block.

8. The semiconductor memory device of claim 1, further comprising:
   a first plug connected to drains of the first select transistors;
   a first switch transistor configured to connect the first plug to a bit line via a second plug;
   a third plug connected to sources of the second select transistors; and
   a second switch transistor configured to connect the third plug to a common source line.

9. The semiconductor memory device of claim 8, wherein the first switch transistor is activated when one of the strings is selected, and each of the first select transistors is activated when a corresponding string is selected.

10. The semiconductor memory device of claim 9, wherein the second select transistors and the second switch transistor are activated simultaneously.

11. A semiconductor memory device, comprising:
   a first silicon substrate having at least one string comprising a first select transistor, a second select transistor, and memory cells connected in series between the first select transistor and the second select transistor;
   a memory material layer having at least one string comprising a first select transistor, a second select transistor, and memory cells connected in series between the first select transistor and the second select transistor;
   a first plug connected to drains of the first select transistors;
   a first switch transistor configured to connect the first plug to a bit line via a second plug;
   a third plug connected to sources of the second select transistors;
   a second switch transistor configured to connect the third plug to a common source line; and
   a peripheral circuit block, on the first silicon substrate, configured to control the first and second select transistors and the memory cells in each of the at least one first silicon substrate string and the at least one memory material layer string,
   wherein a number of the memory cells in the at least one string of the memory material layer is less than a number of the memory cells in the at least one string of the first silicon substrate, and
   wherein a channel length of each of the memory cells in the at least one string of the memory material layer is longer than a channel length of each of the memory cells in the at least one string of the first silicon substrate.

12. The semiconductor memory device of claim 11, wherein the memory cells in the at least one string of the first silicon substrate store M-bit data, and the memory cells in the at least one memory material layer string store single-bit data or N-bit data, where $2<N<M$.

13. The semiconductor memory device of claim 11, wherein the memory cells in the at least one string of the first silicon substrate comprise a first memory block and the memory cells in the at least one string of the memory material layer comprise a second memory block.

14. The semiconductor memory device of claim 11, wherein the memory material layer comprises an epitaxial layer formed using an epitaxial process.

15. The semiconductor memory device of claim 11, wherein the semiconductor memory device comprises a NAND flash memory device.

16. The semiconductor memory device of claim 11, wherein the memory material layer comprises a second silicon substrate, the second silicon substrate opposing the first silicon substrate.

* * * * *